United States Patent
Lin et al.

(10) Patent No.: US 11,639,902 B1
(45) Date of Patent: May 2, 2023

(54) METHOD OF EVALUATING MICROWAVE CHARACTERISTIC

(71) Applicant: NATIONAL CHUNG SHAN INSTITUTE OF SCIENCE AND TECHNOLOGY, Taoyuan (TW)

(72) Inventors: Chia-Ting Lin, Taoyuan (TW); Jian-Long Ruan, Taoyuan (TW)

(73) Assignee: NATIONAL CHUNG SHAN INSTITUTE OF SCIENCE AND TECHNOLOGY, Taoyuan (TW)

(*) Notice: Subject to any disclaimer, the term of this patent is extended or adjusted under 35 U.S.C. 154(b) by 0 days.

(21) Appl. No.: 17/560,304

(22) Filed: Dec. 23, 2021

(51) Int. Cl.
| | |
|---|---|
| *G01R 27/04* | (2006.01) |
| *G01R 27/32* | (2006.01) |
| *G01N 22/00* | (2006.01) |
| *G01R 27/02* | (2006.01) |
| *G01R 29/08* | (2006.01) |
| G01F 23/284 | (2006.01) |
| G01F 23/263 | (2022.01) |
| G01F 25/20 | (2022.01) |

(52) U.S. Cl.
CPC .......... *G01N 22/00* (2013.01); *G01R 27/02* (2013.01); *G01R 27/32* (2013.01); *G01R 29/0878* (2013.01); *G01F 23/266* (2013.01); *G01F 23/284* (2013.01); *G01F 25/20* (2022.01)

(58) Field of Classification Search
CPC ..... G01N 22/00; G01F 23/284; G01F 23/266; G01F 25/20; G01R 27/32; G01R 27/02; G01R 29/0878
USPC .................. 324/76.11–76.83, 459, 600, 629
See application file for complete search history.

(56) References Cited

U.S. PATENT DOCUMENTS

| | | | | |
|---|---|---|---|---|
| 9,658,171 | B2 * | 5/2017 | Xiao ....................... | G01M 11/30 |
| 9,810,646 | B2 * | 11/2017 | Bayram ................. | G01N 22/00 |
| 2007/0239402 | A1 * | 10/2007 | Scott ....................... | G01N 22/00 |
| | | | | 702/22 |
| 2015/0355109 | A1 * | 12/2015 | Bayram ................. | G01N 22/00 |
| | | | | 324/602 |

* cited by examiner

*Primary Examiner* — Raul J Rios Russo

(57) ABSTRACT

A method of evaluating microwave characteristics includes the steps of: (A) measuring thermal diffusion features and microwave characteristics of at least three mode samples to obtain at least three data points, wherein the mode samples include identical constituents but at different ratios thereof; (B) obtaining a mathematical relation between the data points by linear regression; (C) measuring a thermal diffusion feature of a sample under test, wherein the sample under test and the mode samples include identical constituents; and (D) substituting the thermal diffusion feature of the sample under test into the mathematical relation to evaluate a microwave characteristic of the sample under test. The method is applicable to a ceramic material to evaluate microwave characteristics of the ceramic material.

6 Claims, 2 Drawing Sheets

METHOD OF EVALUATING MICROWAVE CHARACTERISTIC

BACKGROUND OF THE INVENTION

1. Field of the Invention

The present disclosure relates to methods of evaluating microwave characteristics, and in particular to a method of evaluating microwave characteristics by linear regression.

2. Description of the Related Art

Microwave plays an important role in communication. Microwave integrated circuit technology has a new trend toward manufacturing a high-speed, compact multi-chip module. The multi-chip module must have a substrate made of dielectrics with a low dielectric loss (tanδ) and a low dielectric constant. Substrate materials with a low dielectric loss are also required for new-generation microwave antennas and communication filters. Both the aforesaid new trend and the design of conventional microwave components require different dielectric materials which serve as the basic materials of a dielectric resonator or a substrate of microwave circuit film. The dielectric materials are selected according to their dielectric properties. Thus, the selection of dielectric materials in the process of designing microwave components must give considerations to a crucial factor, that is, dielectric properties of dielectric materials at microwave frequency. Thus, the technology of measuring microwave dielectric properties is important to selection of materials and development of new materials. Therefore, it is necessary to conduct research on the technology of measuring microwave dielectric properties.

The Parallel Plate Resonance Technique is effective in measuring a dielectric constant and a dielectric loss simultaneously and is advantageously capable of performing a frequency scan (measuring a range of frequency of identical samples, i.e., around 3 GHz). However, measurement errors result from radiation loss, and thus the least possible dielectric loss which can be measured with the Parallel Plate Resonance Technique is $1 \times 10^{-5}$. On the other hand, the TE Cavity Perturbation Technique advantageously requires a sample (round or rectangular cylindrical sample with a cross section area of around 1 mm$^2$) much smaller than any other conventional techniques do. Thus, the TE Cavity Perturbation Technique is useful in the measurement of materials otherwise unsuitable for use in the production of large-sized samples, especially fibrous monocrystals. The TE Cavity Perturbation Technique has another advantage: easy measurement operation and easy process of calculating dielectric properties according to measurement results. However, the least possible dielectric loss which can be measured with the TE Cavity Perturbation Technique is also $1 \times 10^{-5}$.

Existing apparatuses related to communication frequency still have plenty microwave materials to be evaluated. In this regard, the requirement for measurement of microwave properties is strict. However, microwave measurement systems not only have strict requirement for samples but are also expensive. Therefore, it is necessary to provide a method of selecting microwave materials quickly.

BRIEF SUMMARY OF THE INVENTION 3G, 4G, 5G communication systems bring about ever-increasing needs for new microwave materials in material design. There are plenty of research papers on the selection of crystalline ceramic or glass, though existing microwave material design still lacks a complete theoretical basis; and the most challenging issue is: the development of microwave characteristic measurement systems is lagging behind.

In order to address the aforesaid issue, the present disclosure provides a method of evaluating microwave characteristics, comprising the steps of:

(A) measuring thermal diffusion features and microwave characteristics of at least three mode samples to obtain at least three data points, wherein the mode samples comprise identical constituents but at different ratios thereof;

(B) obtaining a mathematical relation between the data points by linear regression;

(C) measuring a thermal diffusion feature of a sample under test, wherein the sample under test and the mode samples comprise identical constituents; and (D) substituting the thermal diffusion feature of the sample under test into the mathematical relation to evaluate a microwave characteristic of the sample under test.

Regarding the method, the microwave characteristic is dielectric loss Df.

Regarding the method, the thermal diffusion feature is thermal diffusivity.

Regarding the method, the thermal diffusivity is measured by Heat Flow Method (HFM), Hot Wire Method (HWM), Hot Plate Method (HPM), Heat Flux Method (HFM), Transient Plane Source (TPS) or Laser Flash Method (LFM).

Regarding the method, the mode samples and the sample under test are made of a ceramic material.

Regarding the method, the mode samples and the sample under test are made of a material system of Ba—Nb—W—O system, Ba—Cu—Sr—Si—O system or BaO—MO—SiO$_2$ system, wherein M is Mg, Zn, Co, Ni, Mn or Cu.

Thermal diffusion is usually measured with a technique, such as Heat Flow Method (HFM), Hot Wire Method (HWM), Hot Plate Method (HPM), Heat Flux Method (HFM), Transient Plane Source (TPS), or Laser Flash Method (LFM). The thermal conductivity of the ceramic material can also be quickly measured with the aforesaid techniques.

The present disclosure entails evaluating the relationship between microwave characteristics and thermal conduction properties with a low dielectric insulating, protective ceramic substrate material, so as to provide a method of evaluating microwave ceramic dielectric loss characteristics. The low dielectric insulating material not only effectively addresses the issue with high-power component circuit signal interference but also serves the purposes of insulation, reinforcement and protection. A further objective of the present disclosure is to address the current demand for 5G communication through the development of microwave ceramic substrate materials.

The present disclosure entails measuring microwave characteristics quickly and conveniently with a ceramic material which has the same operating mechanism for thermal diffusion and microwave dielectric loss properties. There is a linearly-dependent mathematical relation between thermal diffusion and dielectric loss of the ceramic material. The present disclosure provides a way to select microwave materials quickly by replacing measurement of dielectric loss microwave characteristics with measurement of thermal diffusion.

The present disclosure provides a method of evaluating material dielectric loss and thus determining quickly relative microwave characteristics between identical material systems, thereby verifying microwave dielectric loss characteristics of materials.

Regarding material properties testing, microwave characteristics are affected by both a microstructure (especially porosity) and a point defect in a crystal, whereas ceramic thermal diffusion is affected by a point defect in a crystal. Thus, the present disclosure provides a method of evaluating microwave ceramic dielectric loss characteristics by measurement of thermal diffusion, so as to provide a fast-track way to select and evaluate microwave ceramic materials.

DETAILED DESCRIPTION OF THE INVENTION

The implementation of the present disclosure is illustrated with specific embodiments to allow persons skilled in the art to gain insight into the other advantages and effects of the present disclosure. The implementation or application of the present disclosure may also be achieved with any other specific embodiments. All the details of the present disclosure are subject to modifications and changes based on different perspectives and applications without departing from the spirit of the present disclosure.

In a high-frequency, high-speed circuit, electrical characteristics of materials are closely correlated to attenuation and transmission speed of signals and component dimensions. Thus, it is necessary to provide a method of measuring microwave characteristics quickly, so as to cut the cost incurred by manpower, equipment and sample preparation. According to the present disclosure, a mathematical relation is created according to the correlation between a thermal diffusion feature and a microwave dielectric loss characteristic. The microwave dielectric loss characteristics of materials which identical material systems comprise at different constituent ratios are estimated in accordance with the mathematical relation and thermal diffusion feature actual measurement data. The method saves the cost otherwise incurred in conventional measurement of microwave dielectric loss characteristics.

Embodiment 1

Figure 1:
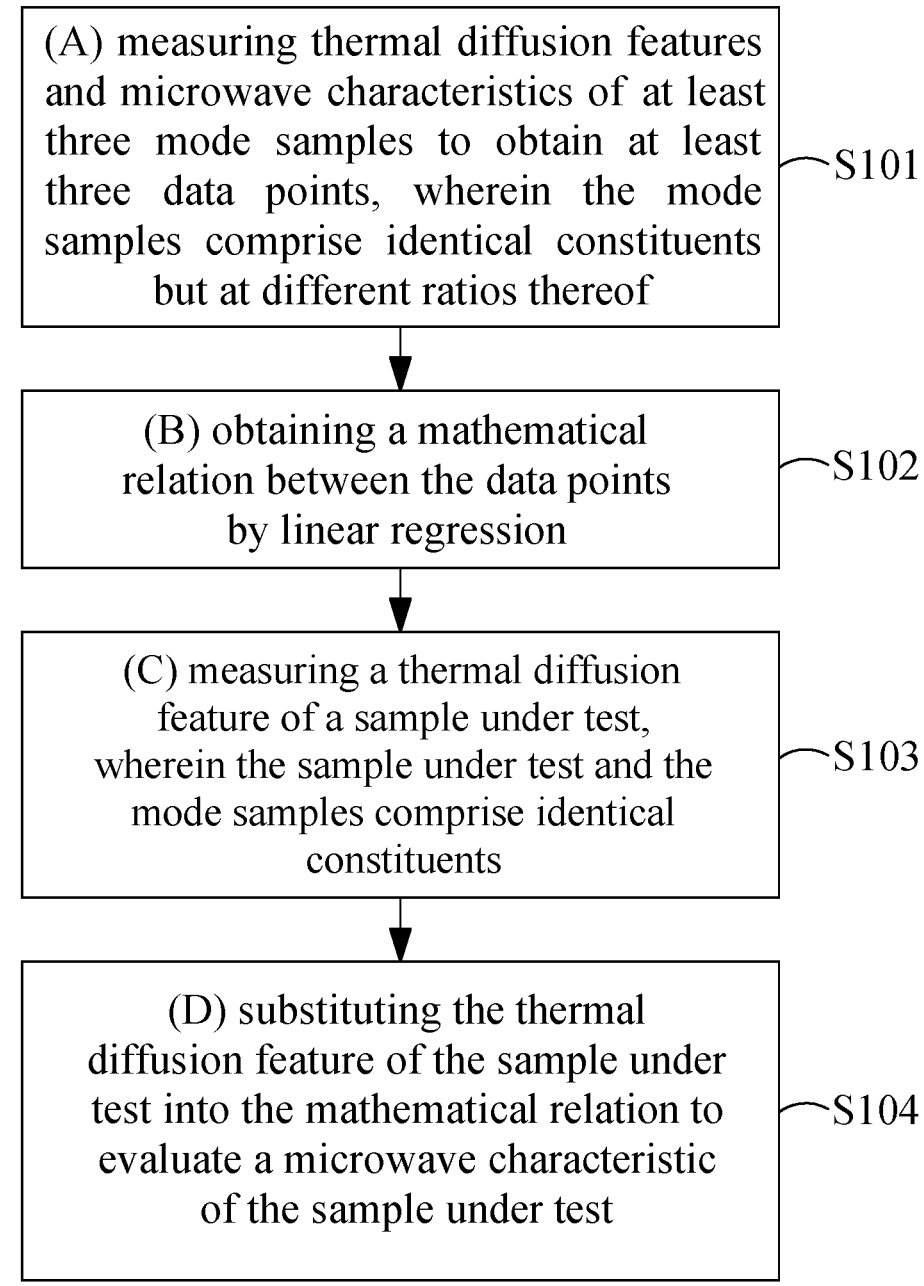
FIG. 1 is a schematic view of the process flow of a method of evaluating microwave characteristics according to embodiment 1 of the present disclosure.

FIG. 1 is a schematic view of the process flow of a method of evaluating microwave characteristics according to embodiment 1 of the present disclosure. As shown in FIG. 1, the method of evaluating microwave characteristics according to the present disclosure comprises the steps of: step (A) S101: measuring thermal diffusion features and microwave characteristics of at least three mode samples to obtain at least three data points, wherein the mode samples comprise identical constituents but at different ratios thereof; step (B) S102: obtaining a mathematical relation between the data points by linear regression; step (C) S103: measuring a thermal diffusion feature of a sample under test, wherein the sample under test and the mode samples comprise identical constituents; and step (D) S104: substituting the thermal diffusion feature of the sample under test into the mathematical relation to evaluate a microwave characteristic of the sample under test.

Figure 2:
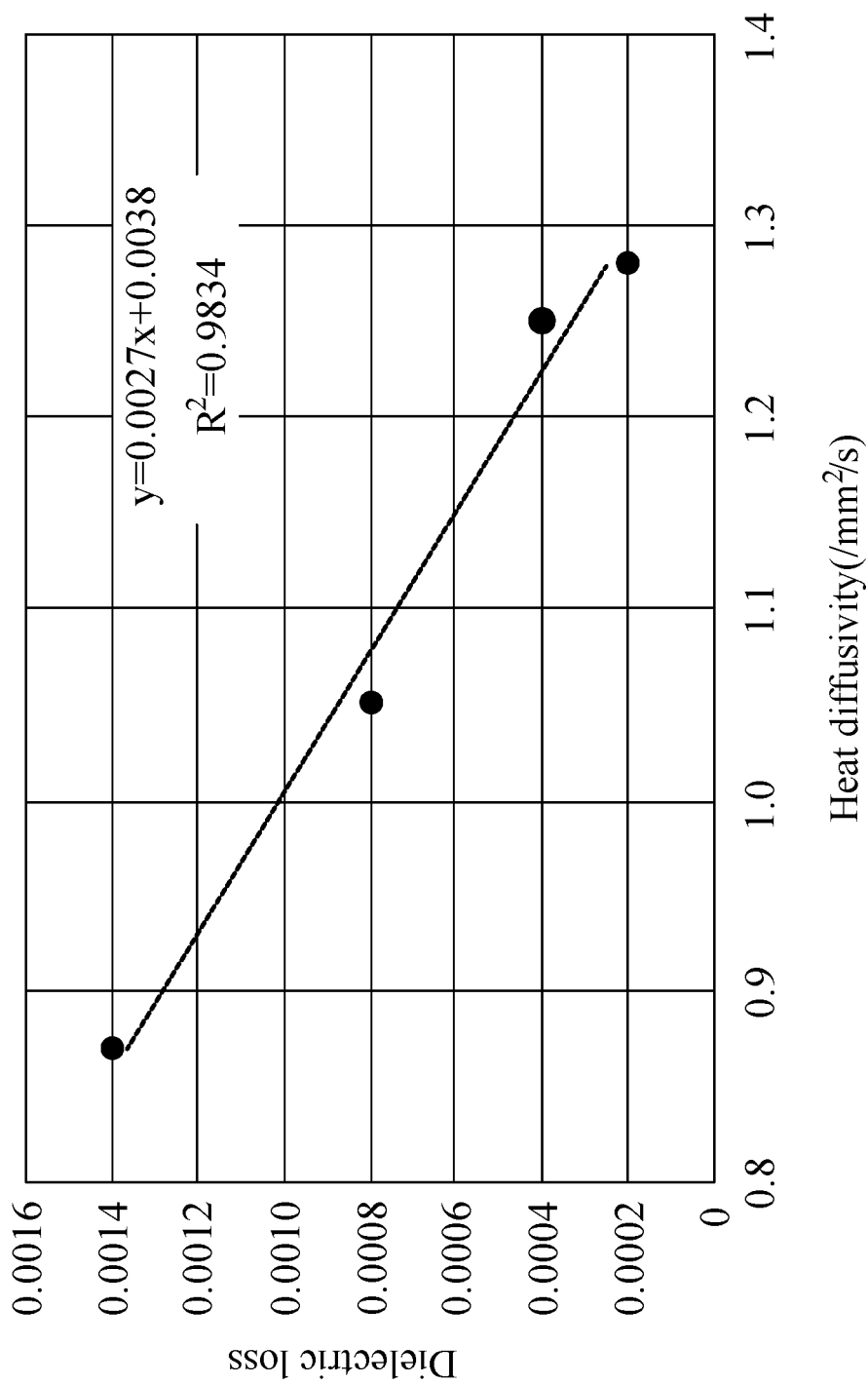
FIG. 2 is a mathematical relation diagram of the method of evaluating microwave characteristics according to embodiment 1 of the present disclosure.

FIG. 2 is a mathematical relation diagram of the method of evaluating microwave characteristics according to embodiment 1 of the present disclosure. As shown in FIG. 2, in embodiment 1, the method of evaluating microwave characteristics involves measuring thermal diffusion features and microwave characteristics of four mode samples to obtain four data points, wherein the mode samples comprise identical constituents but at different ratios thereof. The values of the data points are shown in Table 1 below. In embodiment 1, the thermal diffusion features and microwave characteristics to be measured are thermal diffusivity and dielectric loss, respectively, but the present disclosure is not limited thereto.

TABLE 1

| Thermal diffusivity ($mm^2/s$) | Dielectric loss |
|---|---|
| 1.28 | 0.0002 |
| 1.25 | 0.0004 |
| 1.05 | 0.0008 |
| 0.87 | 0.0014 |

By linear regression, it is feasible to obtain a mathematical relation between the four data points, i.e., y (dielectric loss)=−0.0027x (thermal diffusivity ($mm^2/s$))+0.0038. The number of data points obtained in embodiment 1 serves an illustrative purpose, and the present disclosure is not limited thereto. In another embodiment, three, five or more data points are obtained.

Then, the thermal diffusivity of a sample under test is measured, wherein the sample under test and the mode samples comprise identical constituents. After that, the thermal diffusivity of the sample under test is substituted into the mathematical relation to estimate the dielectric loss of the sample under test, so as to evaluate the microwave characteristics of the sample under test. For example, when the measured thermal diffusivity of a sample under test is 1.15, the mathematical relation y (dielectric loss)=−0.0027x (thermal diffusivity ($mm^2/s$))+0.0038 is used to estimate the dielectric loss of the sample under test at 0.000695.

In embodiment 1, the mode samples and the sample under test are made of a ceramic material comprising a material system of Ba—Nb—W—O system, Ba—Cu—Sr—Si—O system or BaO—MO—$SiO_2$ system, wherein M is Mg, Zn, Co, Ni, Mn or Cu, but the present disclosure is not limited thereto.

Therefore, the method of evaluating microwave characteristics according to the present disclosure dispenses with the hassle of measuring microwave characteristics of identical material systems several times but entails measuring thermal diffusion features (such as thermal diffusivity) and microwave characteristics (such as dielectric loss) of at least three mode samples and thereby quickly evaluating the microwave characteristics of a sample under test comprising constituents at different ratios thereof according to the mathematical relation and the measured thermal diffusion feature data, so as to preliminarily evaluate the microwave characteristics of the sample under test and thereby greatly reduce measurement cost.

The aforesaid embodiments are illustrative rather than restrictive of the present disclosure. Persons skilled in the art may modify or change the aforesaid embodiments without departing from the spirit and scope of the present disclosure. Therefore, the legal protection for the present disclosure should be defined by the appended claims.

What is claimed is:

1. A method of evaluating microwave characteristics, comprising the steps of:
   (A) measuring thermal diffusion features and microwave characteristics of at least three mode samples to obtain at least three data points, wherein the at least three mode samples comprise identical constituents but at different ratios thereof;
   (B) obtaining a mathematical relation between the at least three data points by linear regression;
   (C) measuring a thermal diffusion feature of a sample under test, wherein the sample under test and the at least three mode samples comprise identical constituents; and
   (D) substituting the thermal diffusion feature of the sample under test into the mathematical relation to evaluate a microwave characteristic of the sample under test.

2. The method of claim 1, wherein the microwave characteristic is dielectric loss Df.

3. The method of claim 1, wherein the thermal diffusion feature is thermal diffusivity.

4. The method of claim 3, wherein the thermal diffusivity is measured by Heat Flow Method (HFM), Hot Wire Method (HWM), Hot Plate Method (HPM), Heat Flux Method (HFM), Transient Plane Source (TPS) or Laser Flash Method (LFM).

5. The method of claim 1, wherein the at least three mode samples and the sample under test are made of a ceramic material.

6. The method of claim 5, wherein the at least three mode samples and the sample under test are made of a material system of Ba—Nb—W—O system, Ba—Cu—Sr—Si—O system or BaO—MO—$SiO_2$ system, wherein M is Mg, Zn, Co, Ni, Mn or Cu.

* * * * *